(12) United States Patent
Song et al.

(10) Patent No.: US 7,990,785 B2
(45) Date of Patent: Aug. 2, 2011

(54) DELAY LOCKED LOOP CIRCUIT OF SEMICONDUCTOR DEVICE

(75) Inventors: Hee-Woong Song, Gyeonggi-do (KR); Kun-Woo Park, Gyeonggi-do (KR); Yong-Ju Kim, Gyeonggi-do (KR); Ic-Su Oh, Gyeonggi-do (KR); Hyung-Soo Kim, Gyeonggi-do (KR); Tae-Jin Hwang, Gyeonggi-do (KR); Hae-Rang Choi, Gyeonggi-do (KR); Ji-Wang Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 445 days.

(21) Appl. No.: 12/262,517

(22) Filed: Oct. 31, 2008

(65) Prior Publication Data

US 2009/0116306 A1 May 7, 2009

(30) Foreign Application Priority Data

Nov. 2, 2007 (KR) .................. 10-2007-0111758

(51) Int. Cl.
 *G11C 7/00* (2006.01)
(52) U.S. Cl. .............. 365/194; 365/233.1; 365/189.07; 365/189.09
(58) Field of Classification Search .......... 365/194, 365/233.1, 189.07, 189.09
See application file for complete search history.

(56) References Cited

U.S. PATENT DOCUMENTS

| | | | |
|---|---|---|---|
| 6,707,727 B2* | 3/2004 | Tamura et al. | 365/192 |
| 6,813,197 B2 | 11/2004 | Park et al. | |
| 6,989,700 B2 | 1/2006 | Kim et al. | |
| 7,103,133 B2 | 9/2006 | Jung et al. | |
| 7,154,311 B2 | 12/2006 | Lim et al. | |
| 7,170,313 B2 | 1/2007 | Shin et al. | |
| 7,876,640 B2* | 1/2011 | Lin | 365/233.1 |
| 2005/0249028 A1* | 11/2005 | Harrison | 365/233 |
| 2006/0087908 A1* | 4/2006 | Kim et al. | 365/233 |
| 2006/0267649 A1 | 11/2006 | Park et al. | |
| 2010/0074037 A1* | 3/2010 | Lin | 365/194 |

FOREIGN PATENT DOCUMENTS

JP 2005-251370 9/2005

* cited by examiner

*Primary Examiner* — Tuan T. Nguyen
(74) *Attorney, Agent, or Firm* — IP & T Group LLP

(57) ABSTRACT

A semiconductor memory device includes a delay locked loop circuit that can control input/output timing of data according to a system clock of a high frequency. The semiconductor memory device includes a phase comparator configured to detect a phase difference between an internal clock and a reference clock to output a state signal having a pulse width corresponding to the detected phase difference, a phase adjuster configured to generate a digital code for determining a delay time corresponding to the state signal for locking a phase of the internal clock, a digital-to-analog converter configured to convert the digital code to an analog voltage, and a multiphase delay signal generator configured to delay the internal clock according to a bias voltage corresponding to the analog voltage to feed back the delayed internal clock as the internal clock and generate multiphase delay signals.

19 Claims, 2 Drawing Sheets

DELAY LOCKED LOOP CIRCUIT OF SEMICONDUCTOR DEVICE

CROSS-REFERENCE TO RELATED APPLICATION

The present invention claims priority of Korean patent application number 10-2007-0111758, filed on Nov. 2, 2007, which is incorporated by reference in its entirety.

BACKGROUND OF THE INVENTION

The present invention relates to a semiconductor memory device, and more particularly to a delay locked loop circuit for controlling internal operations so that data corresponding to external commands applied to the semiconductor memory device are output in synchronization with a system clock.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at higher speed. In order for faster and stable operations of semiconductor memory devices, a synchronous semiconductor memory device has been developed, which inputs/outputs data in synchronization with a system clock received from the outside. However, the synchronous semiconductor memory device is still insufficient to meet the required data input/output speed. Thus, a double data rate (DDR) synchronous semiconductor memory device has recently been developed, which inputs/outputs data at a rising edge and a falling edge of the system clock, respectively.

In order to input/output data at the rising and falling edges of the system clock, respectively, the DDR synchronous semiconductor memory device should process two data in each cycle of the system clock. Especially, timing for outputting data should be synchronized exactly with the rising and falling edges of the system clock. To this end, a data output circuit in the DDR synchronous semiconductor memory device serves to control timings for outputting the data internally and transferring the data, to output data in synchronization with the rising and falling edges of the system clock input thereto.

The system clock input to the semiconductor memory device is transferred to the data output circuit through a clock input buffer, a clock transfer line, and the like in the semiconductor memory device. The transferring of the system clock is inevitably accompanied by a delay. In such a case, the data output circuit outputs data to the outside in synchronization with the system clock, which has been delayed before being received by the data output circuit. Then, an external device receives the output data that is not synchronized with the rising and falling edges of the system clock from the semiconductor memory device. Therefore, the external device cannot recognize the correct data output time, and thus cannot sense the data normally.

To address this limitation, the semiconductor memory device is provided with a delay locked loop circuit for compensating the system clock with the delay time due to the internal circuits of the semiconductor memory device through which the system clock is transferred to the data output circuit. The delay locked loop circuit duplicates the delay time of the system clock due to the clock input buffer, clock transfer line and the like through which the system clock is transferred. The delay locked loop circuit adjusts the phase of the input system clock to compensate the system clock for the duplicated delay time, and then outputs the internal clock to the data output circuit. That is, the system clock input to the semiconductor memory device is compensated for the delay time to lock its phase before being transferred to the data output circuit. The data output circuit outputs data in synchronization with the delay locked clock, and the external device determines that the data are output in exact synchronization with the system clock.

Actually, the delay locked clock is transferred from the delay locked loop circuit to the output buffer one cycle before the data output time so that the data are output in synchronization with the transferred delay locked clock. This is intended for allowing the data to be seen as if they are output in exact synchronization with the rising and falling edges of the system clock input to the semiconductor memory device in the outside of the semiconductor memory device. That is, the data output is advanced by a time greater than the delay time of the system clock due to the internal circuits of the semiconductor memory device. As such, in the outside of the semiconductor memory device, the data is seen as if they are output in exact synchronization with the rising and falling edges of the system clock. Accordingly, the delay locked loop circuit is a circuit for finding how soon the data should be output to compensate the data output timing for the delay time in the semiconductor memory device.

Recently, as the semiconductor memory device is required for a rapid operation, the frequency of the system clock input to the semiconductor memory device is increased, and the number of data processed in each cycle of the system clock is also increased from two to four. The newly developed high speed semiconductor memory device utilizes an additional data clock having a frequency two times higher than the system clock together with the system clock, as a reference for the data input/output. For example, if the system clock, which serves as a reference for inputting/outputting commands and addresses, has a frequency of 1 GHz, the data clock has a frequency of 2 GHz. In order that the semiconductor memory device operates in synchronization with the high frequency clock, the delay locked loop circuit, which controls the timing for outputting data to the outside by compensating the system clock for the delay time, can finely and accurately control the variation of the delay time adjusted for the phase lock even if the frequency of the clock is increased.

The conventional delay locked loop circuit detects a phase difference between the system clock and the internal clock reflecting the delay time. Then, the conventional delay locked loop circuit adjusts the phase of the system clock through a delay line including unit cells having a delay time corresponding to the detected phase difference, and feeds back the result. The conventional delay locked loop circuit repeats the operation of tracking the phase difference until the phase is locked. The operation of the conventional delay locked loop circuit includes: compensating the system clock for the delay time, which is obtained by the modeling of the delay time caused during the input/output of the system clock; detecting the phase difference between the compensated clock and the reference clock; controlling the delay elements to reduce the phase difference. The operations of the delay locked loop circuit utilizing the negative delay effect may be accompanied by unwanted change in the delay time or a distortion of the clock due to the variations in the environments such as voltage level, temperature, pressure and process. In addition, the conventional delay locked loop circuit has following limitations: such a phase locked operation takes a somewhat long time; a duty cycle ratio may be changed and be exposed to a variety of noises, a jitter, and the like while varying the phase of the clock using a duplicate delay unit for compensating the clock for the delay time caused by the clock input/output path and the delay line for applying the delay time to the clock through a plurality of delay cells.

As described above, as the semiconductor memory device receives a high frequency clock signal to operate at high speed, the phase locked operation takes a long time, the duty cycle ratio may be varied undesirably, and the semiconductor memory device is vulnerable to noise and jitter. Therefore, there is a demand for a new delay locked loop circuit that can overcome these limitations.

SUMMARY OF THE INVENTION

Embodiments of the present invention are directed to providing a semiconductor memory device including a delay locked loop circuit that can control input/output timing of data according to a system clock of a high frequency.

In accordance with an aspect of the invention, there is provided a semiconductor memory device, which includes a phase comparator configured to detect a phase difference between an internal clock and a reference clock to output a state signal having a pulse width corresponding to the detected phase difference, a phase adjuster configured to generate a digital code for determining a delay time corresponding to the state signal for locking a phase of the internal clock, a digital-to-analog converter configured to convert the digital code to an analog voltage, and a multiphase delay signal generator configured to delay the internal clock according to a bias voltage corresponding to the analog voltage to feed back the delayed internal clock as the internal clock and generate multiphase delay signals.

In accordance with an aspect of the present invention, there is provided a semiconductor memory device, which includes a delay locked loop circuit configured to detect a phase difference between an internal clock and a reference clock and convert the detected phase difference to a digital code using a finite state machine, and to generate multiphase delay signals according to a bias voltage corresponding to the digital code using a voltage controlled delay line (VCDL), and a data input output circuit configured to input/output data in synchronization with the multiphase delay signals.

In accordance with an aspect of the present invention, there is provided a method for delay locking an internal clock in a semiconductor memory device, which includes buffering an internal clock and a reference clock received from an outside, detecting a phase difference between the internal clock and the reference clock to generate a state signal having a pulse width corresponding to the phase difference, sequentially determining a coarse value and a fine value of a delay time corresponding to the pulse width of the state signal using a finite state machine to generate a digital code, converting the digital code to an analog voltage, generating a current corresponding to the analog voltage, generating a bias voltage corresponding to the current, and delaying the internal clock by a delay time corresponding to the bias voltage to generate multiphase delay signals.

As described above, in order to reduce the time taken for the phase lock, the semiconductor memory device in accordance with the embodiment of the invention performs the phase locking operation using the phase adjuster including the finite state machine (FSM) depending on the comparison result output from the phase comparator. Here, the phase comparator can detect up to a maximum value of the phase difference between the internal clock and the reference clock.

In addition, in order to prevent distortion of the clock due to a duty cycle ratio error or a jitter that may be caused in a conventional delay locked loop circuit operating at high speed, the semiconductor memory device adjusts the phase of the internal clock in a digital manner. Then the semiconductor memory device generates the multiphase delay signals using the voltage controlled delay line (VCDL). As such, the semiconductor memory device can obtain the delay locked internal clocks having different phases, and input/output data at high speed by inputting/outputting the data in synchronization with the delay locked internal clocks having different phases according to operation environments.

DESCRIPTION OF SPECIFIC EMBODIMENTS

Hereinafter, a delay locked loop circuit of a semiconductor device in accordance with the present invention will be described in detail with reference to the accompanying drawing.

Figure 1:
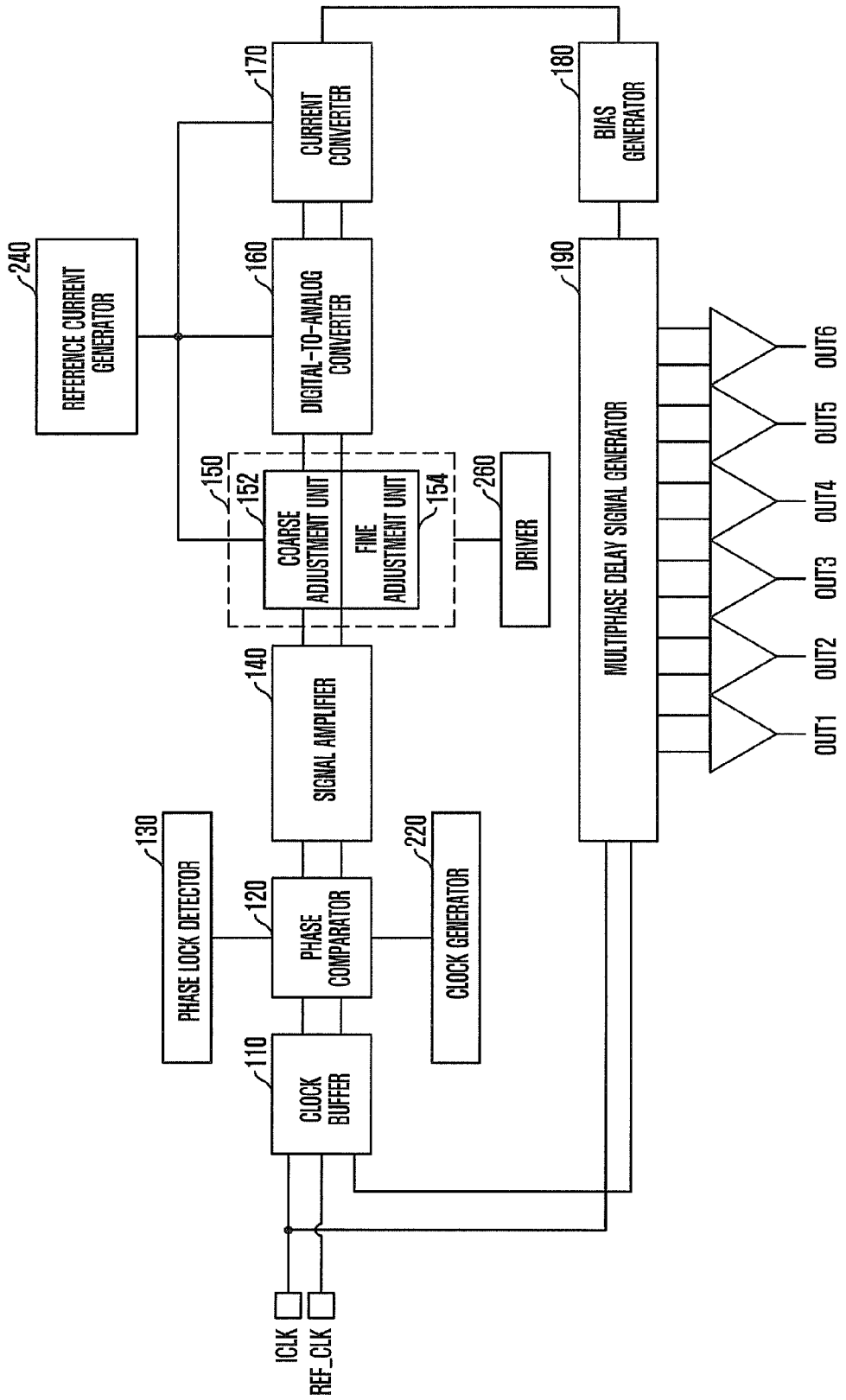
FIG. 1 is a block diagram of a semiconductor memory device in accordance with an embodiment of the present invention.

FIG. 1 is a block diagram of a semiconductor memory device in accordance with an embodiment of the invention.

The semiconductor memory device includes a delay locked loop circuit as shown in FIG. 1. The delay locked loop circuit compares an internal clock ICLK and a reference clock REF_CLK, and converts the detected phase difference to a digital code using a finite state machine (FSM). Further, the delay locked loop circuit applies a bias voltage corresponding to the digital code to a voltage controlled delay line (VCDL) to generate multiphase delay signals OUT1, OUT2, OUT3, OUT4, OUT5 and OUT6. Although not shown, the semiconductor memory device further includes a data output circuit configured to output data transferred from a plurality of unit cells in synchronization with the multiphase delay signals OUT1 to OUT6. Using the data output circuit, the semiconductor memory device can output data corresponding to a read command applied from the outside at a desired point of time.

Specifically, the delay locked loop circuit includes a phase comparator 120, a phase adjuster 150, a digital-to-analog converter 160, and a multiphase delay signal generator 190. The phase comparator 120 detects the phase difference between the internal clock ICLK and the reference clock REF_CLK to generate a state signal having a pulse width corresponding to the detected phase difference. The phase adjuster 150 generates a digital code for determining an amount of a phase shift for locking the phase according to the detected phase difference. The digital-to-analog converter 160 converts the digital code to an analog signal. The multiphase delay signal generator 190 receives the bias voltage corresponding to the output signal of the digital-to-analog converter to delay the internal clock ICLK by a delay time corresponding to the bias voltage, thereby generating the multiphase delay signals and feeding back the delayed internal clock. The multiphase delay signal generator 190 includes a voltage controlled delay line (VCDL) configured to shift the phase (i.e., determine a delay time of the input signal) according to the bias voltage.

The delay locked loop circuit further includes a clock buffer 110 configured to buffer the internal clock fed back from the multiphase delay signal generator 190 and the reference clock REF_CLK to transfer them to the phase comparator 120.

The phase comparator 120 has a comparison range that can detect from a minimum phase difference to a maximum phase difference of the feedback clock and the reference clock REF_CLK. Depending on the detected phase difference, the phase comparator 120 outputs both a state signal representing whether the phase of the feedback clock leads that of the reference clock REF_CLK and a state signal representing whether the phase of the feedback clock lags behind that of the reference clock REF_CLK. Such state signals representing the leading and the lagging of the phase of the feedback clock, respectively, have pulse widths corresponding to the phase difference between the feedback clock and the reference clock REF_CLK. By comparing the phases of the clocks, the phase comparator 120 divides the phase state of the feedback clock into a phase earlier than that of the reference clock REF_CLK, a phase later than that of the reference clock REF_CLK, and a phase equal to that of the reference clock REF_CLK (i.e., a locked phase). The delay locked loop circuit further includes a signal amplifier 140 to prevent a malfunction that may distort or obscure the comparison result. The signal amplifier 140 amplifies the two signals received from the phase comparator 120 to allow only one signal keep a pulse width of a logic high level and the other signal be disabled, and then outputs them to the phase adjuster 150.

The comparison between the internal clock ICLK and the reference clock REF_CLK of the phase comparator 120 is controlled by a clock generator 220. The clock generator 220 divides a frequency of a clock received from the outside at a certain division rate to output the frequency-divided clock to the phase comparator 120. The division rate may be set depending on operation environments and operation modes of the semiconductor memory device. The delay locked loop circuit further includes a phase lock detector 130. When the phases of the feedback clock and the reference clock REF_CLK are identical, the phase lock detector 130 detects the phase locked state of the feedback clock depending on the comparison result of the phase comparator 120. The phase locked state represents that the multiphase delay signals OUT1 to OUT6, which are generated by delaying the internal clock ICLK, have appropriate phases for inputting/outputting data.

The phase adjuster 150, which determines the amount of phase shift according to an output signal of the signal amplifier 140, includes a coarse adjustment unit 152 and a fine adjustment unit 154. The coarse adjustment unit 152 includes a finite state machine for determining a coarse value of the delay time for adjusting the internal clock ICLK, according to the comparison result. The fine adjustment unit 154 includes a finite state machine for determining a fine value of the delay time for adjusting the internal clock ICLK according to the comparison result. If the phase difference between the internal clock ICLK and the reference clock REF_CLK is great, the delay time is calculated coarsely by the coarse adjustment unit 152 and then calculated finely by the fine adjustment unit 154. As such, the time taken for adjusting the phase can be reduced. The phase adjuster 150 outputs the delay time corresponding to the detected phase difference as a digital code. The phase adjuster 150 is connected to a driver 260 for driving the coarse adjustment unit 152 and the fine adjustment unit 154 according to an operation mode when power is applied to the semiconductor memory device. When the phase difference is reduced below a certain value by the repeated comparisons since the first phase locking, the driver 260 may operate only the fine adjustment unit 154 according to an operation mode. As such, power consumption can be reduced.

The delay locked loop circuit further includes a current converter 170 and a bias generator 180. The digital code output from the phase adjuster 150 is converted to an analog voltage by the digital-to-analog converter 160. The current converter 170 converts the analog voltage to a current. The bias generator 180 receives the current from the current converter 170 to generate a bias voltage corresponding to the digital code output from the phase adjuster 150. The bias voltage is used for controlling the delay time in the multiphase delay signal generator 190.

In order to prevent the malfunction of the delay locked loop circuit, the phase adjuster 150, the digital-to-analog converter 160 and the current converter 170 should receive constant current regardless of the operation environments such as process, voltage level, and temperature. Accordingly, the delay locked loop circuit further includes a reference current generator 240 configured to generate a constant reference current regardless of the operation environments.

As described above, the semiconductor memory device receives the internal clock ICLK to generate multiphase delay signals OUT1 to OUT6 having different phases from each other. Although FIG. 1 shows the case where the multiphase delay signal generator 190 outputs six multiphase delay signals OUT1 to OUT6, the number of the multiphase delay signals may be varied according to the operation environments of the semiconductor memory device. For example, in a quad data rate (QDR) semiconductor memory device that inputs/outputs four data in each cycle of a system clock (or a reference clock), the multiphase delay signal generator 190 may output four multiphase delay signals consecutively separated by phase differences of 90° (e.g., having phases of 0°, 90°, 180°, 270°, respectively). In other words, the multiphase delay signals may be N signals consecutively separated by phase differences of 360°/N, where N is a natural number selected according to the operation of the semiconductor memory device.

Figure 2:
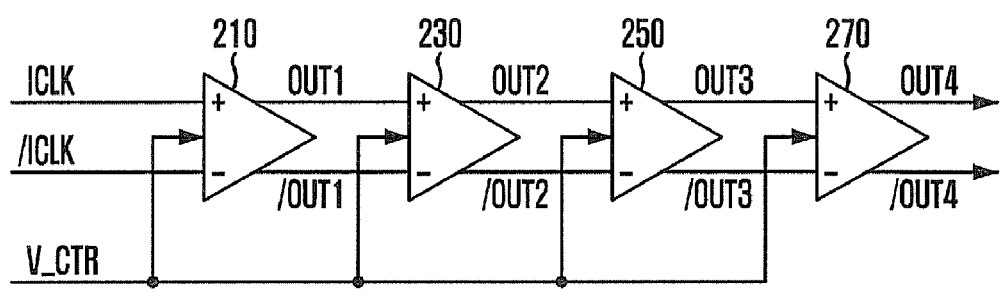
FIG. 2 is a circuit diagram of the multiphase delay signal generator 190 illustrated in FIG. 1.

FIG. 2 is a circuit diagram of the multiphase delay signal generator 190 illustrated in FIG. 1. The multiphase delay signal generator 190 includes a voltage controlled delay line (VCDL) for outputting four multiphase delay signals OUT1 to OUT4 in accordance with one embodiment of the present invention.

The multiphase delay signal generator 190 includes a plurality of delay cells 210, 230, 250 and 270 configured to reflect the delay time corresponding to a bias voltage V_CTR of the bias generator 180 on the internal clock ICLK.

The first to fourth delay cells 210, 230, 250 and 270 reflect the delay time corresponding to the bias voltage V_CTR on the input signal. The delay time becomes shorter as the voltage level of the bias voltage V_CTR becomes higher, and becomes longer as the voltage level of the bias voltage V_CTR becomes lower. Since it is well know to embody each delay cell, detailed structure of each delay cell is omitted Hereinafter, a delay locking operation of the above-described semiconductor memory device will be described.

The clock buffer 110 including a level converter receives the reference clock REF_CLK of an external voltage level from the outside to convert its voltage level to an internal voltage level. Then, the clock buffer 110 outputs the reference clock of the internal voltage level to the phase comparator 120 together with the feedback internal clock received from the multiphase delay signal generator 190. The phase comparator 120 detects the phase difference between the reference clock and the feedback internal clock to generate two state signals having pulse widths corresponding to the phase difference.

The signal amplifier 140 receives the two state signals from the phase comparator 120 to amplify only one available state signal to a logic high level and deactivate the other signal.

The phase adjuster 150 determines the delay time corresponding to the state signal output from the signal amplifier 140 to generate the digital code corresponding to the determined delay time. Here, the coarse adjustment unit 152 calculates the delay time coarsely using the finite state machine, and then the fine adjustment unit 154 calculates the delay time finely. The digital-to-analog converter 160 converts the digital code received from the phase adjuster 150 to the analog signal. The current converter 170 outputs current corresponding to the potential level of the analog signal received from the digital-to-analog converter 160. The bias generator 180 generates the bias voltage for controlling the delay time of the multiphase delay signal generator 190 according to the current received from the current converter 170. Finally, the multiphase delay signal generator 190 delays the internal clock ICLK by the delay time corresponding to the bias voltage to generate the multiphase delay signals OUT1 to OUT6. The multiphase delay signal generator 190 also feeds back the delayed internal clock to the clock buffer 110.

As described above, the semiconductor memory device sequentially performs the coarse adjustment and then the fine adjustment. As such, the semiconductor memory device can reduce the time taken for locking the phase, and reduce the time and power even in the case where a phase difference is caused again after the previous phase lock and thus a readjustment is required. Further, the semiconductor memory device outputs the phase delay amount as the digital code using the finite state machine (FSM), converts the digital code to the analog voltage using the digital-to-analog converter (DAC), and delays the internal clock according to the bias voltage corresponding to the analog voltage. As such, the semiconductor memory device can reduce a jitter caused by the variations and errors of the delay time in the high frequency operation.

In accordance with the embodiment of the invention, the semiconductor memory device outputs a plurality of data in synchronization with the respective multiphase delay signals generated by the delay locked loop circuit according to operation environments and conditions. As such, the semiconductor memory device can input/output data at high speed.

In addition, the semiconductor memory device adjusts the phase comparison result in a digital manner using the finite state machine and accordingly generates the bias voltage, to thereby generate the multiphase delay signals corresponding to the bias voltage. As such, the semiconductor memory device can reduce distortion of the internal clock due to jitter and noise.

While the invention has been described with respect to a specific embodiment, it will be apparent to those skilled in the art that various changes and modifications may be made without departing from the spirit and scope of the invention as defined in the following claims.

What is claimed is:

1. A semiconductor memory device, comprising:
   a phase comparator configured to detect a phase difference between an internal clock and a reference clock to output a state signal having a pulse width corresponding to the detected phase difference;
   a phase adjuster configured to generate a digital code for determining a delay time corresponding to the state signal for locking a phase of the internal clock;
   a digital-to-analog converter configured to convert the digital code to an analog voltage; and
   a multiphase delay signal generator configured to delay the internal clock according to a bias voltage corresponding to the analog voltage to feed back the delayed internal clock as the internal clock and generate multiphase delay signals.

2. The semiconductor memory device as recited in claim 1, further comprising a signal amplifier configured to amplify the state signal and then transfer the amplified state signal to the phase adjuster.

3. The semiconductor memory device as recited in claim 1, further comprising:
   a current converter configured to convert the analog voltage to a current; and
   a bias generator configured to generate the bias voltage corresponding to the current.

4. The semiconductor memory device as recited in claim 3, further comprising a reference current generator configured to output a reference current to the phase adjuster, the digital-to-analog converter and the current converter, the reference current being constant regardless of operation environments including process, voltage level and temperature.

5. The semiconductor memory device as recited in claim 1, wherein the multiphase delay signal generator includes a voltage controlled delay line (VCDL) configured to shift the internal clock according to the bias voltage.

6. The semiconductor memory device as recited in claim 5, wherein the multiphase delay signals are consecutively separated from one another by phase differences of 90°, and each of the multiphase delay signals is used as a reference clock.

7. The semiconductor memory device as recited in claim 1, wherein the phase adjuster includes:
   a coarse adjustment unit configured to include a finite state machine for determining a coarse value of the delay time depending on the state signal; and
   a fine adjustment unit configured to includes a finite state machine for determining a fine value of the delay time depending on the state signal,
   wherein the delay time determined by the coarse adjustment unit and the fine adjustment unit is output as the digital code.

8. The semiconductor memory device as recited in claim 7, further including a driver configured to drive the coarse adjustment unit and the fine adjustment unit when power is applied to the semiconductor memory device.

9. The semiconductor memory device as recited in claim 1, further comprising:
   a phase lock detector configured to detect a phase locked state depending on the state signal; and
   a clock generator configured to divide an externally applied clock to generate a control clock for controlling an operation time of the phase comparator.

10. The semiconductor memory device as recited in claim 1, further comprising a clock buffer configured to buffer the internal clock and the reference clock and then transfer the buffered internal clock and the reference clock to the phase comparator.

11. A semiconductor memory device, comprising:
    a delay locked loop circuit configured to detect a phase difference between an internal clock and a reference clock and convert the detected phase difference to a digital code using a finite state machine, and to generate multiphase delay signals according to a bias voltage corresponding to the digital code using a voltage controlled delay line (VCDL); and
    a data input output circuit configured to input/output data in synchronization with the multiphase delay signals.

12. The semiconductor memory device as recited in claim 11, wherein the delay locked loop circuit includes:
- a phase comparator configured to detect the phase difference to output a state signal having a pulse width corresponding to the detected phase difference;
- a phase adjuster configured to generate the digital code for determining a delay time corresponding to the pulse width of the state signal for locking a phase of the internal clock using the finite state machine;
- a digital-to-analog converter configured to convert the digital code to an analog voltage;
- a current converter configured to convert the analog voltage output from the digital-to-analog converter to a current;
- a bias generator configured to generate the bias voltage corresponding to the current received from the current converter; and
- a multiphase delay signal generator configured to delay the internal clock by the delay time corresponding to the bias voltage using the voltage controlled delay line to feed back the delayed internal clock to the phase comparator as the internal clock and generate the multiphase delay signals.

13. The semiconductor memory device as recited in claim 12, further including a signal amplifier configured to amplify the state signal before transferring it to the phase adjuster.

14. The semiconductor memory device as recited in claim 11, further including a reference current generator configured to output to the delay locked loop circuit a reference current which is constant regardless of operation environments including process, voltage level and temperature.

15. The semiconductor memory device as recited in claim 11, wherein the multiphase delay signals are consecutively separated from one another by phase differences of 90°, and the data input output circuit inputs/outputs the data in synchronization with the multiphase delay signals.

16. The semiconductor memory device as recited in claim 11, wherein the multiphase delay signals are N signals consecutively separated from one another by phase differences of 360°/N, where N is a natural number.

17. The semiconductor memory device as recited in claim 12, further including a clock buffer configured to buffer the internal clock and reference clock before transferring it to the phase comparator.

18. A method for delay locking an internal clock in a semiconductor memory device, the method comprising:
- buffering an internal clock and a reference clock received from an outside;
- detecting a phase difference between the internal clock and the reference clock to generate a state signal having a pulse width corresponding to the phase difference;
- sequentially determining a coarse value and a fine value of a delay time corresponding to the pulse width of the state signal using a finite state machine to generate a digital code;
- converting the digital code to an analog voltage;
- generating a current corresponding to the analog voltage;
- generating a bias voltage corresponding to the current; and
- delaying the internal clock by a delay time corresponding to the bias voltage to generate multiphase delay signals.

19. The method as recited in claim 18, further comprising:
amplifying the state signal to an available logic level; and
feeding back the delayed internal clock as the internal clock.

* * * * *